United States Patent [19]
Wondrak et al.

[11] Patent Number: 5,578,859
[45] Date of Patent: Nov. 26, 1996

[54] SEMICONDUCTOR STRUCTURE HAVING ONE OR MORE LATERAL, HIGH-BLOCKING SEMICONDUCTOR COMPONENTS

[75] Inventors: Wolfgang Wondrak, Frankfurt; Raban Held, Mömbris; Erhard Stein, Mörfelden-Walldorf; Horst Neubrand, Frankfurt, all of Germany

[73] Assignee: Daimler-Benz AG, Stuttgart, Germany

[21] Appl. No.: 256,588

[22] PCT Filed: Dec. 23, 1992

[86] PCT No.: PCT/EP92/02985

§ 371 Date: Jan. 9, 1995

§ 102(e) Date: Jan. 9, 1995

[87] PCT Pub. No.: WO93/14522

PCT Pub. Date: Jul. 22, 1993

[30] Foreign Application Priority Data

Jan. 18, 1992 [DE] Germany ............................. 42 01 276

[51] Int. Cl.$^6$ .......................... H01L 23/58; H01L 29/861
[52] U.S. Cl. ........................ 257/492; 257/487; 257/491; 257/493; 257/603
[58] Field of Search .................................... 257/603, 604, 257/605, 606, 487, 488, 489, 491, 495, 492, 493

[56] References Cited

U.S. PATENT DOCUMENTS 3,411,051  11/1968  Kilby ..................................... 317/235

FOREIGN PATENT DOCUMENTS 3135269  6/1982  Germany.
54-016184  2/1979  Japan.
63-081984  4/1988  Japan.

OTHER PUBLICATIONS

Sin et al: "High Voltage Characteristics of Resurfed Schottky Injection FETs". In: Solid–State Electronics, vol. 32, No. 4, 1989, pp. 317–322.
Huang et al: "Extension of Resurf Principle to Dielectrically isolated Power Devices". In: Conf. Report ISPED 1991, Baltimore, pp. 27–30.
Nakagawa et al: "A Novel High Voltage Device Structure on Thin SOI for VLSIs". In: Japanese Journal of Applied Physics, Int. Conf. on Solid State Devices and Materials 1991, Aug. 27–29, Yokohama, JP, pp. 731–732.
Quin Lu et al: "High Voltage Silicon-on–Insulator (SOI) MOSFETs"; In: Electronic Letters, vol. 25, No. 8, Apr. 13, 1989, Stvenage, GB, pp. 536–537.
Nakagawa et al: "200° C. High–Temperature and High–Speed Operation of 440 V Lateral IGBTs on 1.5 μm thick SOI". 1993, IEEE,pp. 28.5.1.–28.5.4.
Merchant et al: "Realization of High Breakdown Voltage (>700 V) in Thin SOI Devices". 1991, IEEE, pp. 31–34.
Nakagawa et al: "Breakdown Voltage Enhancement for Devices on Thin Silicon Layer/Silicon Dioxide Film". In: IEEE Transactions on Electron Devices, vol. 38, No. 7, Jul. 1991, New York, US, pp. 1650–1654.

*Primary Examiner*—Robert P. Limanek
*Assistant Examiner*—David B. Hardy
*Attorney, Agent, or Firm*—Spencer & Frank

[57] ABSTRACT

A semiconductor structure having one or a plurality of lateral, high-blocking semiconductor components in a semiconductor of a metalized substrate (2), a dielectric layer (3) contiguous to the substrate, a homogeneously doped drift zone (4) disposed above the dielectric layer, and having heavily-doped zones of the semiconductor components which are formed in or extend into the drift zone and are electrically contacted. At least the zones (5, 6) of the semiconductor components, which can have a high potential difference with respect to the substrate during operational functioning mode of the semiconductor components, extend up to the dielectric layer (3).

10 Claims, 3 Drawing Sheets

SEMICONDUCTOR STRUCTURE HAVING ONE OR MORE LATERAL, HIGH-BLOCKING SEMICONDUCTOR COMPONENTS

BACKGROUND OF THE INVENTION

The invention relates to a semiconductor structure having one or a plurality of lateral, high-blocking semiconductor components in a semiconductor arrangement. The semiconductor arrangement comprises a metalized semiconductor substrate, a dielectric layer contiguous to the semiconductor substrate, an electric, homogeneously doped drift zone disposed above the dielectric layer, and heavily-doped zones of the semiconductor components that are cut into the drift zone from the surface of the semiconductor and are electrically contacted.

A semiconductor structure of this type is known from the essay "Extension of Resurf Principle to Dielectrically Isolated Power Devices" of the conference report Conf. Report. ISPSD 1991, Baltimore, pages 27 to 30. This essay concerns the typical structure of a lateral diode on a dielectrically isolated substrate. Such structures, which are to be categorized under the general term "smart power technology," represent a connecting link between digital controls and power components. This technology permits the integration of logic, protection and diagnosis functions into power components.

An essential point of the discussed technology is the integration of a plurality of power components on a so-called semiconductor wafer, hereinafter to be referred to only as semiconductor, with the individual components being completely isolated from one another.

This isolation is to be executed such that the respective component is electrically isolated with respect to the other contiguous semiconductor regions. The lateral isolation is typically effected in such a way that trenches are etched around the component and subsequently filled with a dielectric. The dielectric isolation parallel to the surface of the semiconductor, that is, in the lateral direction, is effected either by the formation of a p-n junction loaded in the blocking direction, or by the use of a dielectric, such as silicon oxide. The tendency is clearly toward dielectric isolation, because in this technology parasitic elements are avoided and, among other things, a simpler design with increased immunity to interference is possible. The achieved maximum blocking voltages, or breakdown voltages, of the components are above all determined by the isolation capability of the "buried dielectric" and, on the other hand, by the surface properties in the surface regions in which the p-n junctions reach the surface. To avoid a surface breakdown, so-called field plates, among others, are used in the region of the p-n junctions on the surface.

On the other hand, the breakdown voltage is primarily limited in that the entire voltage is created between the substrate, which is typically grounded, and the highly-doped regions of the semiconductor components at high potential, which leads to high field intensities. On the one hand, increasing the thickness of the drift zone in order to step up the breakdown voltage leads to considerable problems, because with an increasing thickness, the expenditure for the lateral isolation by means of isolating etching and subsequent filling with isolation material becomes difficult. On the other hand, to achieve high breakdown voltages, the thickness of the buried dielectric cannot be made arbitrarily large, because otherwise an insufficient dissipation of the power loss must be taken into consideration due to the too-low thermal conductivity; this generally leads to thermal problems during operation of the component. In the use of silicon oxide layers, thicknesses of the dielectric layer in a range of 0.5 to 4.5 μm have proven to still be useful.

To achieve high breakdown voltages for lateral, dielectrically isolated components in semiconductors of silicon having a drift zone thickness of less than 30 μm, different measures were discussed, for example laterally buried dopings on the border surface to the dielectric layer, or additional diffusion areas in the substrate being able to be connected to the dielectrically isolated components. The known solutions, however, have the disadvantage that they are technically very difficult to realize and, on the other hand, they severely impair the otherwise good dielectric isolation.

The object of the invention is to modify the semiconductor structure defined at the outset such that integrated, dielectrically isolated semiconductor components for high blocking voltages, particularly above 400 V, can be produced in a simple way.

SUMMARY OF THE INVENTION

This object is accomplished according to the invention in that at least the zones of the semiconductor structure, which can be at high potential in operational functioning mode of the semiconductor elements, extend up to the dielectric layer.

In this way, the entire voltage drop is practically shifted toward the dielectric layer. It is particularly advantageous to select the doping concentration of the drift zone such that the product of this doping concentration and the thickness of the drift zone is in a range of $10^{12}$ to $2\times10^{12}$ cm$^{-2}$, by means of which a stepped-up breakdown voltage can be achieved with a relatively small drift zone thickness and with little technical expenditure.

An advantageous modification consists of subdividing the drift zone into vertically extending, highly-doped partial zones that are separated from one another. In this way the electrical field is additionally laterally expanded, and the field intensity maximum is thereby further reduced.

Modifications of the invention are to be taken from the dependent claims.

The nature of the invention is to be explained in detail below in conjunction with the embodiments represented in the drawing figures.

DETAILED DESCRIPTION OF THE PREFERRED EMBODIMENTS

Figure 1:
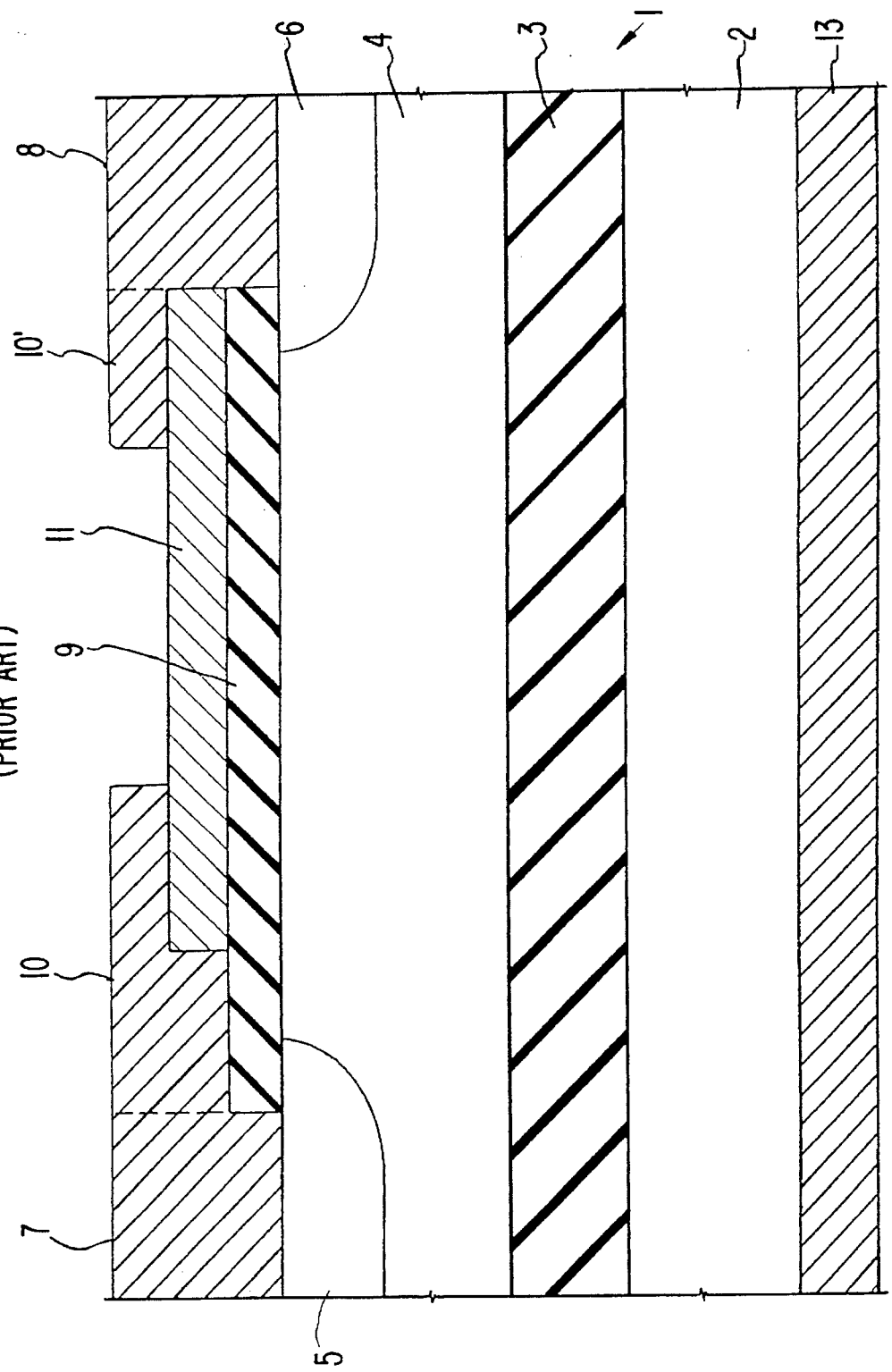
FIG. 1 shows a known semiconductor structure having a laterally disposed diode.

In the known semiconductor structure according to FIG. 1, the semiconductor arrangement 1 of silicon comprises an n$^+$-conductive semiconductor substrate 2, a dielectric layer 3 disposed on the substrate 2, and, for example, a p$^-$-conductive drift zone 4 above (on) the dielectric layer 3. Two highly-doped zones, namely the p$^+$-conductive zone 5 and the n+-conductive zone 6, are diffused into the lightly-doped drift zone 4. These two zones 5 and 6 form the anode and cathode, respectively of the diode. The anode region 5 is provided with a metalization 7 for the anode contact, and the cathode region 6 is provided with a metalization 8 for the cathode region. Between the anode contact 7 and the cathode contact 8, an insulating layer 9 extends laterally so far across the surface of the semiconductor arrangement 1 that it overlaps at least the region in which the p-n junctions reach the surface and, as field plates 10 and 10', reduces the field intensity on the surface and thus reduces the surface breakdown. The semiconductor substrate 2 is provided with a metalization 13 typically at earth potential. Because anode or cathode is typically at high potential, a drop in potential occurs in the vertical direction from the highly-doped regions toward the metalization 13, with the main drop in potential occurring in the drift zone 4 and at the dielectric layer 3. It can easily be seen that the breakdown voltage can be stepped up with increasing thickness of the drift zone 4 and with greater thickness of the dielectric layer 3, which is, however, disadvantageous for the above-named reasons.

Figure 2:
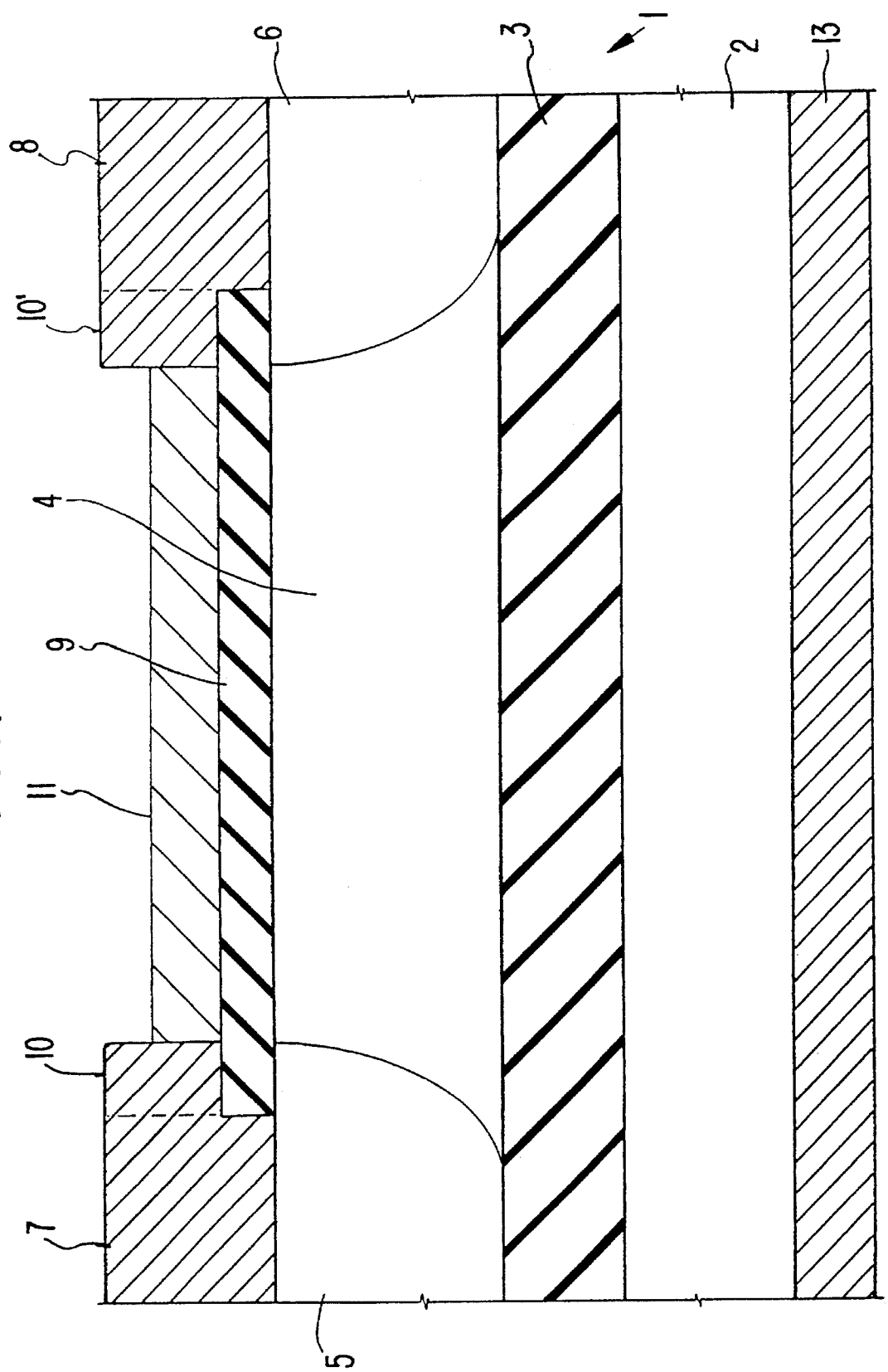
FIG. 2 shows a semiconductor structure having a diode according to the invention.

FIG. 2 illustrates a semiconductor structure according to the invention, into which a diode is integrated, as in FIG. 1. In the representations of FIGS. 1 and 2, identical parts are provided with the same reference numerals. In FIG. 2, the semiconductor body 1, as in the embodiment according to FIG. 1, comprises a semiconductor substrate 2 which can be both p- as well as n-conductive, and has a metalization 7, a dielectric layer 3 and a drift zone 4.

Two highly-doped, p+-conductive and n+-conductive zones 5 and 6 are diffused into the drift zone 4, and the diffusion boundary extends to the dielectric layer 3. The voltage drop, therefore, is practically entirely at the dielectric layer 3, so that the thickness of the drift zone 4 can be selected to be relatively small in comparison to the known components.

The thickness of the dielectric layer 3 is advantageously in a range of 1 to 4 μm, while the thickness of the drift zone 4 can be selected to be between 1 and 30 μm. To achieve a maximum breakdown voltage, the product of the thickness of the drift zone 4 and the doping concentration should be in a range of $10^{12}$ to $2 \times 10^{12}$ cm$^{-2}$. Lower dopings cause a slight drop in the breakdown voltage, but clearly higher dopings lead to a significant reduction in the breakdown voltage.

An insulating layer 9 is again provided between the metalizations 7 and 8 in the anode region 5 and the cathode region 6. A resistance layer 11 preferably composed of silicon doped with oxygen is disposed on this insulating layer 9. This resistance layer 11 is connected at its ends to respectively the anode contact 8 and the cathode contact 7, so that a drop in potential occurs above the resistance layer 11 in the lateral direction. In this way a linear potential distribution on the surface of the semiconductor arrangement 1, and hence a reduction in the breakdown region, is reduced in the region of the p-n junctions reaching the surface.

Figure 3:
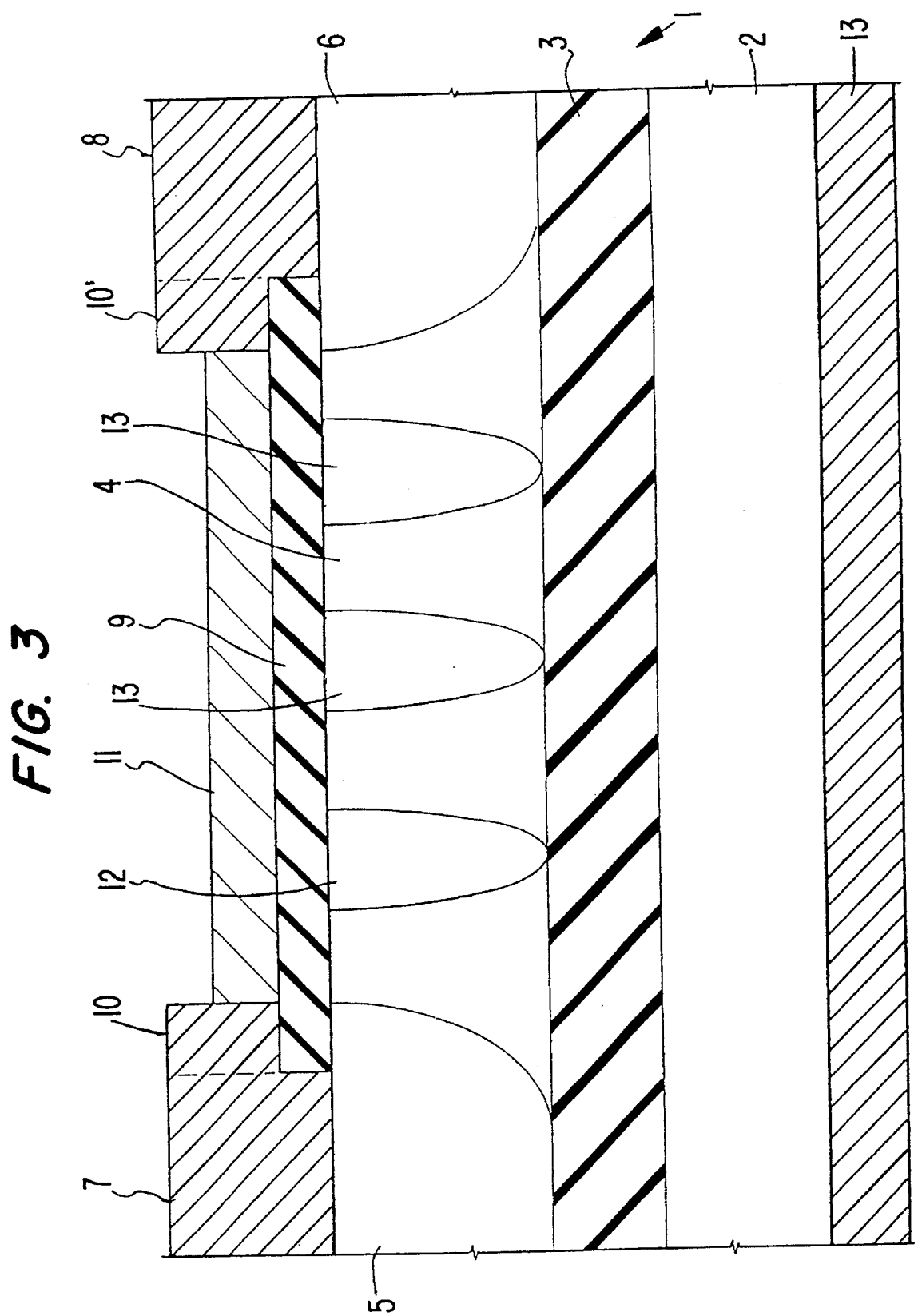
FIG. 3 shows a modification of the semiconductor structure according to FIG. 2.

In contrast to the embodiment according to FIG. 2, in the embodiment according to FIG. 3, vertically upwardly extending regions 12 which extend from the insulating layer 9 up to the dielectric layer 3 are provided in the drift zone 4. In this embodiment, not only is the vertical voltage drop completely shifted onto the dielectric layer 3, but the lateral electrical field is distributed approximately uniformly over the length of the dielectric layer 3, thus reducing the field intensity maximum.

We claim:

1. Semiconductor structure having at least one lateral, high-blocking semiconductor component in a semiconductor arrangement, comprising: a metalized semiconductor substrate, a dielectric layer contiguous to the semiconductor substrate, a homogeneously doped drift zone disposed on the dielectric layer, and heavily-doped zones of the semiconductor component which are formed in the drift zone and are electrically contacted, and wherein at least the heavily-doped zones of the semiconductor components, which have a high potential difference compared to the substrate during an operational functioning mode of the semiconductor component, extend to the dielectric layer, and said drift zone has a thickness in a range of 1 to 30 μm and is subdivided into vertically extending, highly-doped partial zones that are separated from one another.

2. Semiconductor structure according to claim 1, wherein the zones extending to the dielectric layer are formed by diffusion of impurities.

3. Semiconductor structure according to claim 1, wherein the semiconductor arrangement is composed of silicon.

4. Semiconductor structure according to claim 1, wherein a product of the thickness and the doping concentration of said drift zone is in a range of $1 \times 10^{12}$ to $2 \times 10^{12}$ cm$^{-2}$.

5. Semiconductor structure according to claim 1, wherein said partial zones extend from a surface of the semiconductor arrangement to said dielectric layer.

6. Semiconductor structure according to claim 1, wherein said dielectric layer has a thickness of 1 to 4 μm.

7. Semiconductor structure according to claim 1, wherein said dielectric layer is composed of silicon oxide.

8. Semiconductor structure according to claim 1, further comprising a resistance layer isolated with respect to a surface of the semiconductor arrangement and disposed at least in a region between two p-n junctions reaching the surface, said resistance layer being respectively at a predetermined potential at its two lateral ends.

9. Semiconductor structure according to claim 8, wherein said resistance layer is composed of silicon doped with oxygen.

10. Semiconductor structure according to claim 8, wherein insulation for the surface of the semiconductor arrangement is formed by a silicon oxide layer.

\* \* \* \* \*